United States Patent [19]

Przybyla et al.

[11] Patent Number: 5,525,959

[45] Date of Patent: Jun. 11, 1996

[54] DEVICE FOR MONITORING THE FUNCTIONS OF A PLURALITY OF CONTROL UNITS IN A MOTOR

[75] Inventors: Bernd Przybyla, Schwieberdingen; Reinhard Palesch, Eberdingen-Hochdorf, both of Germany

[73] Assignee: Robert Bosch GmbH, Stuttgart, Germany

[21] Appl. No.: 777,552

[22] PCT Filed: Jun. 26, 1990

[86] PCT No.: PCT/DE90/00481

§ 371 Date: Feb. 6, 1992

§ 102(e) Date: Feb. 6, 1992

[87] PCT Pub. No.: WO91/02257

PCT Pub. Date: Feb. 21, 1991

[30] Foreign Application Priority Data

Aug. 8, 1989 [DE] Germany ............. 39 26 172.7
Oct. 20, 1989 [DE] Germany ............. 39 34 974.8

[51] Int. Cl.[6] .................................................. B60Q 11/00
[52] U.S. Cl. ..................... 340/438; 340/439; 340/459; 340/461; 340/525
[58] Field of Search .................................. 340/439, 458, 340/459, 461, 462, 525; 364/424.03, 186

[56] References Cited

U.S. PATENT DOCUMENTS

| | | | |
|---|---|---|---|
| 2,571,360 | 2/1950 | Hallerberg | 340/459 |
| 4,816,806 | 3/1989 | Ohishi et al. | 340/459 |
| 4,965,550 | 10/1990 | Wroblewski | 340/525 |
| 5,003,478 | 3/1991 | Kobayashi et al. | 364/424.03 |
| 5,395,384 | 9/1994 | Przybyla et al. | 364/424.04 |

*Primary Examiner*—John K. Peng
*Assistant Examiner*—Daryl C. Pope
*Attorney, Agent, or Firm*—Michael J. Striker

[57] ABSTRACT

The device for monitoring functions of control devices of a motor vehicle includes a single monitoring indicator; monitoring signal devices in each control device which generate a monitoring signal characteristic of their operation; a driver stage for controlling the single monitoring indicator located in a central control device; a device for controlling the monitoring signal devices so that monitoring signals are produced, advantageously one after the other, in response to a switch-on signal; a device for producing the switch-on signal such as an ignition device, and at least one line to which each control device is connected so that, when the monitoring signal is produced, the monitoring signal thus produced is transmitted to the central control device including the driver stage and the driver stage controls the single monitoring indicator according to the monitoring signal so produced. In preferred embodiments the duration and/or signal interval of the monitoring signal is characteristic of the control device from which it originates.

22 Claims, 2 Drawing Sheets

DEVICE FOR MONITORING THE FUNCTIONS OF A PLURALITY OF CONTROL UNITS IN A MOTOR

BACKGROUND OF THE INVENTION

The invention is directed to a device for monitoring the functions of a plurality of control devices in a motor vehicle by means of a single monitoring indicator.

In vehicles commonly in use today a plurality of electronic control devices are usually provided which fulfill specific operating and safety functions in the operation of the vehicle. Such control devices serve e.g. to control and/or regulate the ignition, the fuel supply, the transmission, anti-skid means, power, exhaust gas, the braking process and the like. These control devices are commonly connected with one another via a common diagnostic bus at which a diagnostic connection is provided for checking the good working order of the control devices with a testing device. Further, the control devices can be connected with one another via a communications bus (e.g. CAN bus).

A monitoring indicator which is constructed e.g. as a monitoring light is assigned to every control device and lights up when there is an error in the associated control device. After the supply voltage is switched on, a so-called testing process takes place in every control device. This testing process switches on the monitoring light of every control device for the purpose of displaying the operability of every control device and its respective monitoring light. The testing process is terminated after a predetermined time period or at the occurrence of a determined event, e.g. when the engine is started. This test corresponds to the process presently used with other monitoring lights built into the dashboard, e.g. the oil indicator light. The expenditure on wiring is very high with this solution, particularly when a large number of control devices is provided. Further, a driver stage is required for every monitoring light, making the device costly.

It is further known to provide one monitoring light for a plurality of control devices, which monitoring light can be switched on by every control device. Again, this also requires a number of driver stages corresponding to the number of control devices. Above all, in a great number of control devices, synchronizing the individual test processes and control processes for the monitoring lights poses technical problems, is expensive and is hardly practical in terms of expenditure if there are more than two control devices. Moreover, with inadequate synchronization a flickering of the monitoring lights occurs during testing which impairs ease of monitoring.

SUMMARY OF THE INVENTION

In keeping with these objects and with others which will become apparent hereinafter, one feature of the present invention resides, briefly stated, in that the device for monitoring has switching means for controlling a monitoring indicator in only one control device, the control devices are connected with one another via at least one diagnostic and/or bus line, the monitoring signals can be transmitted to the first mentioned control device with the switching means for controlling the monitoring indicator, and the signal for the monitoring indicator can be influenced as a function of the monitoring signals.

When the device is designed in accordance with the present invention it has the advantage that only one individual monitoring indicator and one driver stage are required for monitoring functions with the use of already existing diagnostic and/or communications lines between the control devices. A flickering of the monitoring indicator cannot occur. Handling is technically simple and an expansion with additional control devices can be realized easily. This does not bring about any increase in hardware expenditures which are low in any case.

Advantageous further developments and improvements of the device further are made possible by the steps.

The diagnostic bus, which usually has one or two individual lines and is already present for external diagnosis, is advisably used as communications line between the individual control devices. When using this diagnostic bus for monitoring functions, one line serves for the transmission of the monitoring signals and the other line serves as status line, e.g. to distinguish between the testing phase and external diagnosis. If the status line is not present or is used for some other purpose, an external testing device must test the line with the monitoring signals before starting a diagnosis so as to determine whether or not functions are being monitored. The diagnosis may only take place after this.

The control device connected with the monitoring indicator is preferably a central control device which is always present in the vehicle, particularly a control device for controlling or regulating ignition and/or fuel injection. Accordingly, the driver stage and other switching means for monitoring functions can always already be provided primarily in this central control device while the rest of the control devices can always be produced without a driver stage.

Starting from a switch-on signal, the monitoring signals of the individual control devices are advantageously produced one after the other in a fixed sequence and fed to the testing device. The monitoring signals advisably have fixed signal lengths and/or signal intervals. The synchronization of this signal sequence is made possible in a simple manner by the common diagnostic bus.

In the simplest case the testing device has means for testing the completeness of the monitoring signals which are formed as simple pulses. For example, the testing device can be a counting stage. But it is also possible to form the monitoring signals as information sequences or to provide them with such information sequences. Accordingly, additional information can be obtained concerning which control devices are in good order and/or in which control devices errors have occurred. For this purpose the information sequences contain information concerning the state of the respective control device and/or its identification. Corresponding data can be stored in the central control device so that they can be detected quickly during an external diagnosis, which is particularly important when possible defective functioning of individual control devices only occurs sporadically.

If the control devices are connected with one another via a common communications line, e.g. CAN, all control devices transmit information to the central control device in the manner described above as messages of the transmission protocol belonging to the communications bus.

An error indication or identification of defective control devices can also be visually conveyed to the driver in that the monitoring indicator emits fixed light sequences and/or intensity sequences depending on the results of the function test.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENT

Figure 1:
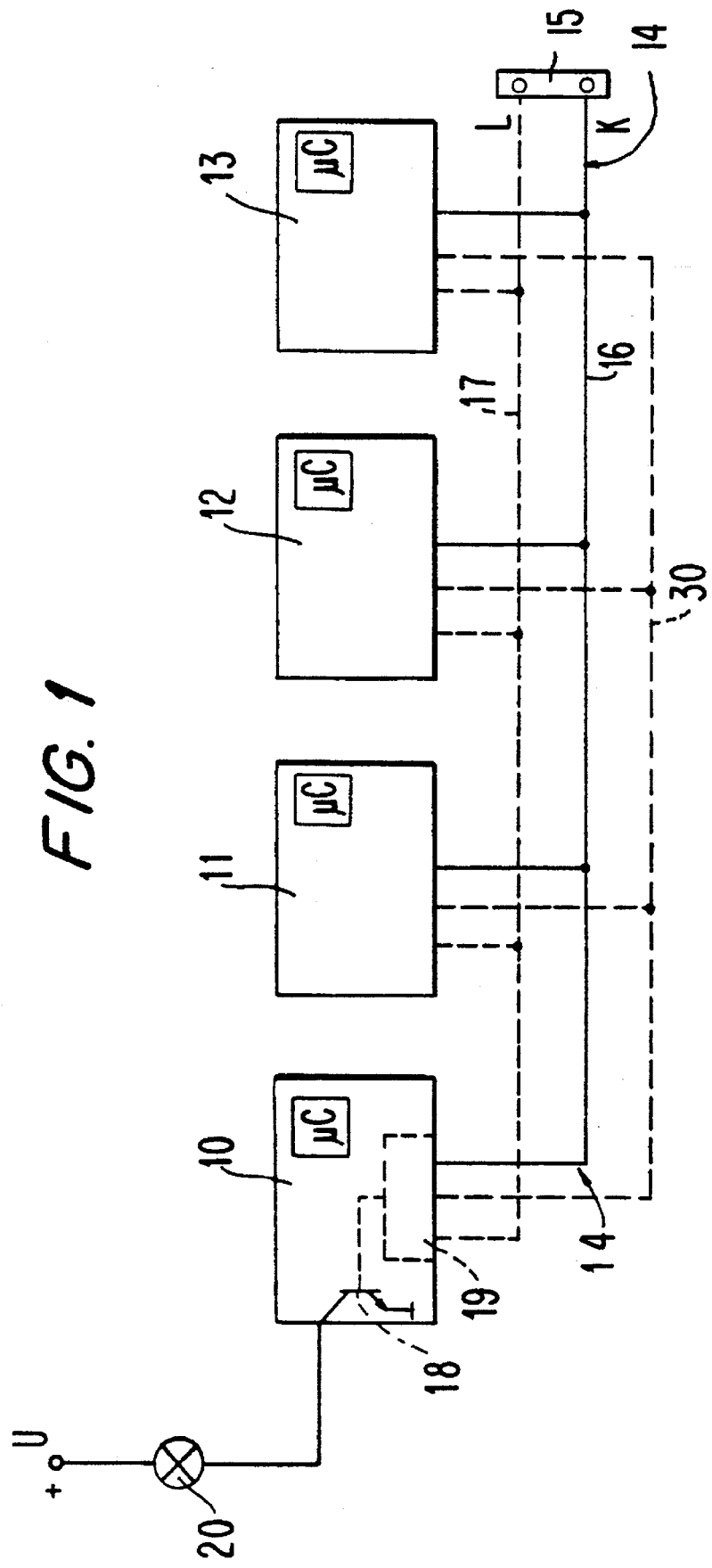
FIG. 1 shows a block wiring diagram of the embodiment example with four control devices.

In the embodiment example shown in FIG. 1 four electronic control devices 10–13 are arranged in a vehicle, not shown. The control device 10 is a control device which is present in every construction and stage of development of the respective vehicle, that is, e.g. an ignition and/or fuel injection control device. The other three control devices can be e.g. control devices for controlling and/or regulating the transmission, anti-skid means, power, braking process or the like. These control devices 10–13 have conventional microcomputers, μC and are connected with one another and with a diagnostic connection 15 for connecting external diagnostic devices via a diagnostic bus 14. The diagnostic bus 14 is standard in many vehicles and has a so-called K-line 16 and an L-line 17 which is optional and shown with the dashed lines in FIG. 1. Further, the control devices can be connected with one another via a communications bus 30.

A driver stage 18, shown in a simplified manner, is provided in the control device 10 constructed as main control device and is controlled by a testing device 19. A monitoring indicator constructed e.g. as a monitoring light 20 is connected to the output of the driver stage 18, its second connection being connected to the positive pole of the supply voltage U.

The manner of operation of the embodiment example shown in FIG. 1 is explained in the following with reference to the signal diagram shown in FIG. 2.

In the present embodiment example, the L-line 17 has a 1 signal which permits the monitoring of functions. In the case of an external diagnostic process, a 0 signal would be supplied to the L-line 17 which causes a switching to the external diagnostic process. Synchronization and transmission of the individual monitoring signals to the testing device 19 in the control device 10 is effected via the K-line. This is effected in a provided time-slot pattern. The monitoring cycle begins on a switch-on signal E, while the individual control devices send monitoring signals of length $T_2$ at fixed intervals $T_3$ to the latter. The monitoring signals of the first, second and nth control device are shown in the diagram. The signal interval between the switch-on signal E and the first monitoring signal is $T_1$. Of course, the same time interval can also be provided in this case. It is likewise possible, in principle, to give the monitoring signals or signal intervals various lengths and to accommodate either the start of the individual monitoring signals or the signal intervals in a fixed time grid.

The incoming monitoring signals are recorded and evaluated in the testing device 19. In the simplest case this can be effected via a counting device which counts the incoming monitoring signals or monitoring pulses after corresponding pulse processing and detection following the switch-on signal E. When the provided numerical value corresponding to the number of connected control devices has been reached, the proper functioning of all control devices is detected and a corresponding control of the driver stage 18 and monitoring light 20 is effected until the occurrence of the switch-off signal A. This control shows the user that the monitoring light 20 and the driver stage 18 themselves are working properly. If there is a defect in one of the control devices either no monitoring signal at all occurs prior to the switch-off signal A or the monitoring signal formed as a zero pulse remains a zero signal. In either case, an irregular monitoring signal is accordingly detected, which causes the testing device 19 to trigger the monitoring light 20 either not at all or only after the signal A so that this is detected as an error.

In another variant, not shown, it is possible, e.g. with the actuation of the ignition key before starting the engine, to have the monitoring light or another monitoring indicator light up and only be extinguished when there is no error report or when an error is not already stored in the central control device.

Since the monitoring signals arrive in the testing device 19 in fixed sequence, it is possible to store such errors as error signals which characterize the control device whose monitoring signal was transmitted in an irregular manner. Accordingly, an external diagnosis can immediately establish which of the control devices has an error, which is particularly important when this error has only occurred sporadically.

If the degree of equipment in the composite system of connected control devices, i.e. the number and type of connected control devices, is stored in the control device 10 the testing device 19 can automatically detect and determine the number of anticipated monitoring signals by corresponding access. Otherwise, the testing device 19 must be preprogrammed correspondingly.

Figure 2:
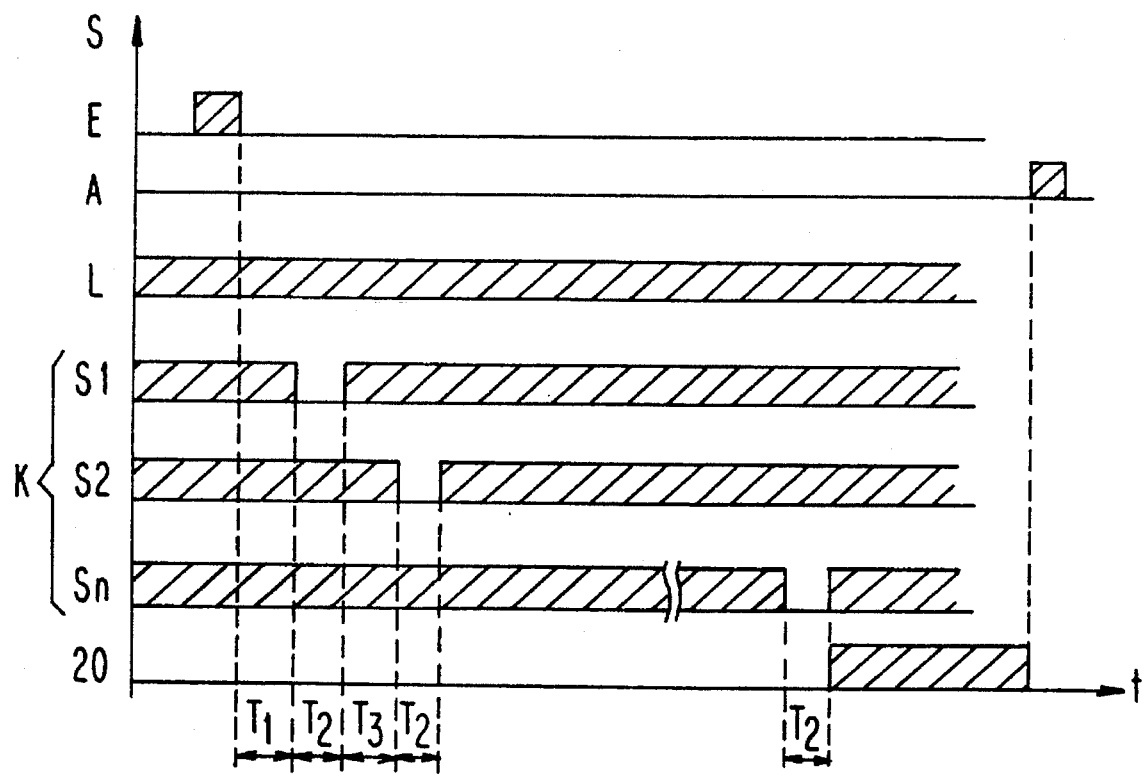
FIG. 2 shows a signal diagram to explain the manner of operation with the use of monitoring pulses.
Figure 3:
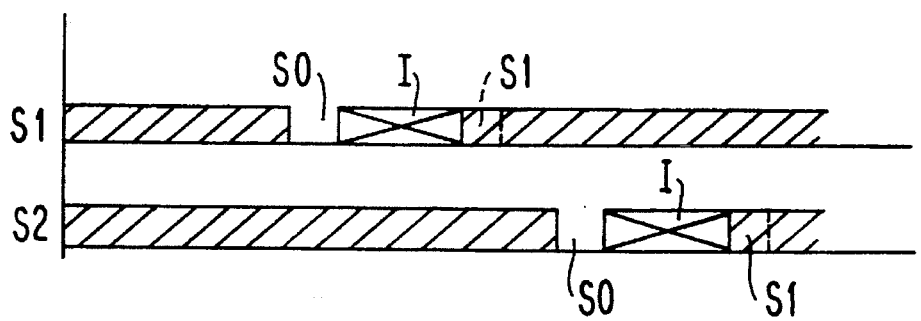
FIG. 3 explains the manner of operation of a construction in which additional information sequences occur.

Instead of a simple monitoring signal according to FIG. 2, the individual control devices 11–13 can also send information sequences I according to FIG. 3. A start bit $S_0$ and a stop bit $S_1$, respectively, are provided before and after every information sequence I. For example, the start bits $S_0$ of the individual control devices can be produced one after the other in a fixed time grid. The information sequence I contains control device addresses and the monitoring report of the sending control device, for example. Accordingly, it can be registered in a simple manner which control device is not in good working order and whether there is only one operating disturbance or a total failure, e.g. when neither the monitoring signal nor the control device address is sent. In this case possibilities are offered in an even more diverse manner for storing incoming information concerning disturbances and failures in the testing device 10 to facilitate an external diagnosis subsequently.

If the control devices are connected with one another via a common communications bus 30, e.g. CAN, all control devices transmit information to the central control device in the manner described above as messages of the transmission protocol belonging to the communications bus.

The driver of the vehicle can be given information concerning possible errors or failures also immediately after the conclusion of the function test in that the monitoring lights 20 are controlled in a fixed encoded manner as a function of detected disturbances, e.g. by different light and/or intensity sequences. Thus, a sequence of three blinks can indicate an error in the transmission control unit, while a sequence of two blinks designates an error in the anti-skid regulating device.

It will be understood that each of the elements described above, or two or more together, may also find a useful application in other types of constructions differing from the types described above.

While the invention has been illustrated and described as embodied in a device for monitoring the functions of a plurality of control devices in a motor vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A device for monitoring functions of a plurality of control devices in a motor vehicle, said device for monitoring functions comprising a single monitoring indicator; means for producing a monitoring signal in each of said control devices; switching means for controlling said single monitoring indicator, said switching means being formed as a driver stage connected to said single monitoring indicator and being located in only one of said control devices; means for controlling said means for producing monitoring signal in each of said control devices so that a plurality of said monitoring signals are produced in response to a switch-on signal; means for producing said switch-on signal and at least one line, each of said control devices being connected with said at least one line, so that when said monitoring signal is produced, said monitoring signal thus produced is transmitted to said one control device including said switching means and said driver stage controls said single monitoring indicator according to said monitoring signal so produced, wherein said monitoring signal has a signal duration characteristic of said control device producing said monitoring signal.

2. A device as defined in claim 1, wherein said at least one line includes a diagnostic bus consisting of two diagnostic lines.

3. A device as defined in claim 2, wherein one of said diagnostic lines includes means for transmitting the monitoring signal and another of said diagnostic lines is a status line.

4. A device as defined in claim 1, wherein said at least one line includes a diagnostic bus consisting of a single diagnostic line.

5. A device as defined in claim 4, further comprising external testing means for testing said single diagnostic line for the presence of said monitoring signal.

6. A device as defined in claim 5, wherein said external testing means includes means for diagnosing said control devices after an absence of said monitoring signal from said diagnostic line is detected.

7. A device as defined in claim 1, wherein said one control device having said switching means is a central control device of said motor vehicle.

8. A device as defined in claim 7, wherein said central control device comprises means for controlling ignition and fuel injection in said motor vehicle.

9. A device for monitoring functions of a plurality of control devices in a motor vehicle, said device for monitoring functions comprising a single monitoring indicator; means for producing a monitoring signal in each of said control devices; switching Weans for controlling said single monitoring indicator, said switching means being formed as a driver stage connected to said single monitoring indicator and being located in only one of said control devices; means for controlling said means for producing a monitoring signal in each of said control devices so that a plurality of said monitoring signals are produced one after the other in response to a switch-on signal; means for producing said switch-on signal and at least one line, each of said control devices being connected with said at least one line, so that, when said monitoring signal is produced, said monitoring signal thus produced is transmitted to said one control device including said switching means and said driver stage controls said single monitoring indicator according to said monitoring signal so produced, wherein said monitoring signal has a signal interval characteristic of said control device producing said monitoring signal.

10. A device as defined in claim 9, wherein said at least one line includes a diagnostic bus consisting of two diagnostic lines.

11. A device as defined in claim 10, wherein one of said diagnostic lines includes means for transmitting the monitoring signal and another of said diagnostic lines is a status line.

12. A device as defined in claim 9, wherein said one control device including said switching means is a central control device of said motor vehicle and said central control device includes means for controlling ignition and fuel injection in said motor vehicle.

13. A device for monitoring functions of a plurality of control devices in a motor vehicle, said device for monitoring functions comprising a single monitoring indicator; means for producing a monitoring signal in each of said control devices; switching means for controlling said single monitoring indicator, said switching means being formed as a driver stage connected to said single monitoring indicator and being located in only one of said control devices; means for controlling said means for producing a monitoring signal in each of said control devices so that a plurality of said monitoring signals are produced in response to a switch-on signal; means for producing said switch-on signal and at least one line, each of said control devices being connected with said at least one line, so that, when said monitoring signal is produced, said monitoring signal thus produced is transmitted to said one control device including said switching means and said driver stage controls said single monitoring indicator according to said monitoring signal so produced, wherein said monitoring signal has a signal interval and signal duration characteristic of said control device producing said monitoring signal.

14. A device as defined in claim 13, wherein said at least one line includes a diagnostic bus consisting of two diagnostic lines.

15. A device as defined in claim 14, wherein one of said diagnostic lines includes means for transmitting the monitoring signal and another of said diagnostic lines is a status line.

16. A device as defined in claim 13, wherein said one control device including said switching means is a central control device of said motor vehicle and said central control device includes means for controlling ignition and fuel injection in said motor vehicle.

17. A device for monitoring functions of a plurality of control devices in a motor vehicle, said device for monitoring functions comprising a single monitoring indicator;

means for producing a monitoring signal in each of said control devices; switching means for controlling said single monitoring indicator, said switching means being formed as a driver stage connected to said single monitoring indicator and being located in only one of said control devices; means for controlling said means for producing a monitoring signal in each of said control devices so that a plurality of said monitoring signals are produced one after the other in response to a switch-on signal; means for producing said switch-on signal and at least one line, each of said control devices being connected with said at least one line, so that, when said monitoring signal is produced, said monitoring signal thus produced is transmitted to said one control device including said switching means and said driver stage controls said single monitoring indicator according to said monitoring signal so produced, wherein said monitoring signal includes a data word.

18. A device as defined in claim 17, wherein said data word encodes information concerning a state of said control device producing said monitoring signal and an identity of said control device producing said monitoring signal.

19. A device as defined in claim 17, wherein said at least one line includes a communications bus for transmitting said monitoring signal.

20. A device as defined in claim 17, wherein said one control device including said switching means is a central control device of said motor vehicle and said central control device includes means for controlling ignition and fuel injection in said motor vehicle.

21. A device as defined in claim 19, wherein said monitoring signal is part of a transmission protocol of said communication bus.

22. A device as defined in claim 21, wherein said monitoring signal includes information concerning a state of said control device producing said monitoring signal and an identity of said control device producing said monitoring signal.

* * * * *